US012646815B1

(12) United States Patent
Tsironis

(10) Patent No.: US 12,646,815 B1
(45) Date of Patent: Jun. 2, 2026

(54) TRI-STATE TUNING PROBE WITH SINGLE CONTROL

(71) Applicant: Christos Tsironis, St-Laurent (CA)

(72) Inventor: Christos Tsironis, Kirkland, CA (US)

( * ) Notice: Subject to any disclaimer, the term of this patent is extended or adjusted under 35 U.S.C. 154(b) by 255 days.

(21) Appl. No.: 18/519,339

(22) Filed: Nov. 27, 2023

(51) Int. Cl.
| | |
|---|---|
| *H03H 7/40* | (2006.01) |
| *G01R 27/32* | (2006.01) |
| *H01P 5/04* | (2006.01) |

(52) U.S. Cl.
CPC ............... *H01P 5/04* (2013.01); *G01R 27/32* (2013.01); *H03H 7/40* (2013.01)

(58) Field of Classification Search
CPC .... H03H 7/38; H03H 7/40; H01P 5/04; H01P 3/023; G01R 31/2822; G01R 27/32; G01R 27/04
See application file for complete search history.

(56) References Cited

U.S. PATENT DOCUMENTS

| | | |
|---|---|---|
| 6,980,064 B1 | 12/2005 | Boulerne |
| 8,098,112 B2 | 1/2012 | Simpson |

| | | | |
|---|---|---|---|
| 8,358,186 B1 | 1/2013 | Tsironis | |
| 9,252,738 B1 | 2/2016 | Tsironis | |
| 9,625,556 B1 | 4/2017 | Tsironis | |
| 12,379,405 B1 * | 8/2025 | Tsironis | ............... G01R 35/005 |

OTHER PUBLICATIONS

"Load Pull" [online] Wikipedia, [Retrieved on Aug. 24, 2017]. Retrieved from Internet <URL: https://en.wikipedia.org/wiki/Load_pull>.
"Computer Controlled Microwave Tuner—CCMT", Product Note 41, Focus Microwaves Inc., Jan. 1998.

* cited by examiner

*Primary Examiner* — Stephen E. Jones

(57) ABSTRACT

Tri-state triple band remotely configurable tuning probes for slide screw impedance tuners allow instantaneous larger frequency coverage beyond the capacity of existing tuning probes using the single horizontal and vertical axis mechanism of a prior art single probe, single band tuner. This is done by combining two tuning slugs, a master slug and a slave slug into a configurable tuning probe assembly mounted in the same mobile tuner carriage and controlled using a single vertical axis mechanism. To avoid spurious resonance phenomena the tuning slugs are controlled, driven, and locked vertically sliding on each other, and guided appropriately allowing smooth, uninhibited vertical movement of the metallic bodies.

8 Claims, 8 Drawing Sheets

FIG. 5A
FIG. 5B
FIG. 5C
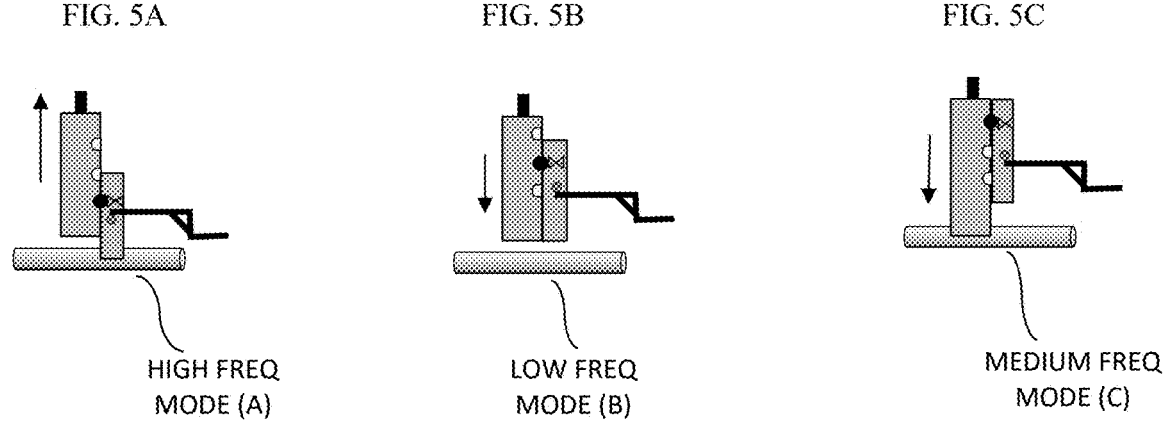
HIGH FREQ
MODE (A)
LOW FREQ
MODE (B)
MEDIUM FREQ
MODE (C)
FIG. 5D
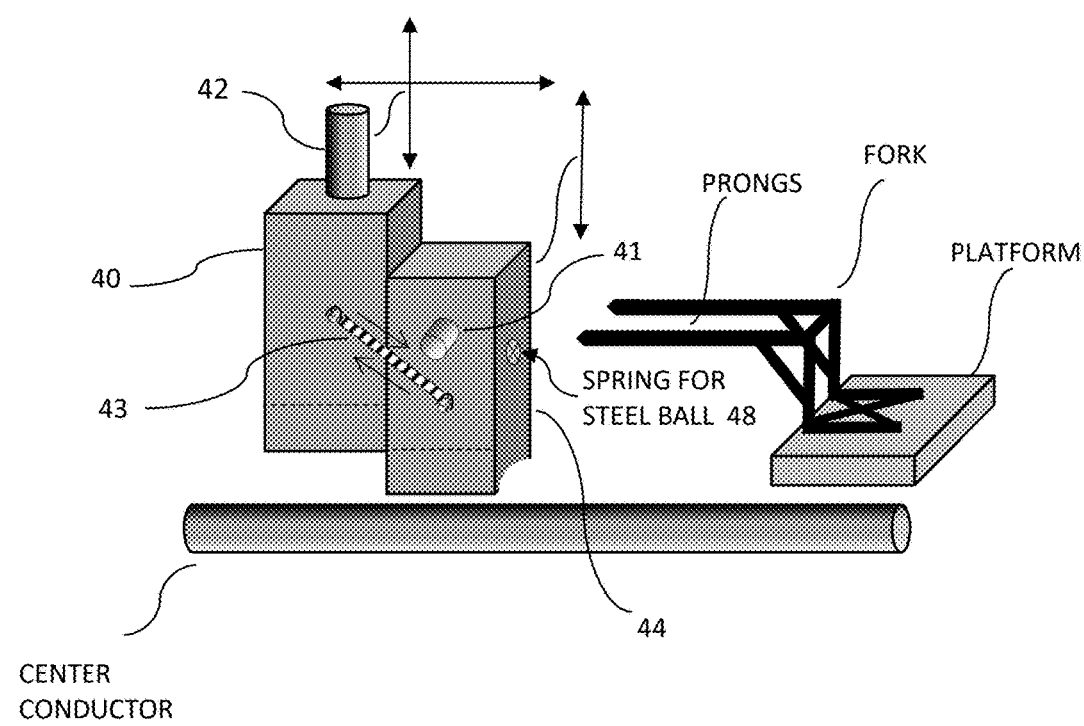

TRI-STATE TUNING PROBE WITH SINGLE CONTROL

PRIORITY CLAIM

Not Applicable

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. Tsironis, C. U.S. Pat. No. 8,358,186, "Impedance Tuners with Resonant Probes".
4. Boulerne, P. U.S. Pat. No. 6,980,064, "Slide-screw Tuner with Single Corrugated Slug".
5. Simpson, G. U.S. Pat. No. 8,098,112, "Impedance Tuner Systems and Probes".
6. Tsironis, C. U.S. Pat. No. 9,252,738, "Wideband Tuning Probes for Impedance Tuners and Method".
7. Tsironis, C. U.S. Pat. No. 9,625,556, "Method for Calibration and Tuning with Impedance Tuners".

BACKGROUND OF THE INVENTION

This invention relates to general microwave testing and in particular to testing of microwave transistors (DUT) in the high frequency (typically GHz range) domain using Load Pull (see ref. 1). Load Pull is a measurement method whereby the load impedance presented to the DUT at a given frequency is changed systematically and the DUT performance is registered, with the objective to find an optimum embedding (matching) network for obtaining the design objectives, which may be maximum gain, power, efficiency, linearity or else.

PRIOR ART

The popular load pull method for testing and characterizing medium to high-power microwave transistors (DUT, device under test) is called "load-pull" and uses appropriate test setups (FIG. 1), see ref. 1. Low noise transistors are tested using "source-pull". Load or source pull use impedance tuners 2, 4 (see ref. 2) and other test equipment, such as signal or noise sources 1, test fixtures housing the DUT 3, and power meters or low noise receivers 5, the whole controlled by a computer 6; the computer controls and communicates with the tuners 2, 4 and the other equipment 1, 5 using digital cables 7, 8, 9. The tuners are used in order to manipulate the microwave impedance conditions in a systematic and controlled manner, under which the DUT is tested (see ref. 1); impedance tuners allow determining the optimum impedance conditions of embedding networks for designing amplifiers and other microwave components for specific performance targets, such as noise parameters, gain, efficiency, intermodulation etc. For devices in chip-form, tested preferably on-wafer (see ref. 5), the insertion loss between the DUT and the tuner reduces the effective reflection factor ILOAD at the DUT reference plane. The only method to increase the reflection factor in a passive system is increasing the reflection factor of the tuner. Since the tuning probe 34 is capacitively coupled with the center conductor 33, this means increasing the maximum controllable capacitance by increasing the surface between the probes and the center conductor, which is possible, while avoiding a short circuit, only by increasing its horizontal length 37. Various types of resonant or combination tuning probes, including one or more slugs, have been reported before (see ref. 3, 4, 5 and 6); however, none includes configurable vertical movement of the individual slugs using a single vertical axis mechanism; in ref. 4 to 6 the objective has been to increase the tuning dynamic (GAMMA MAX) in certain frequency areas using statically configured multi slug tuning probes, and in ref. 3 the objective was frequency selective tuning operation of single slug tuning probes.

BRIEF DESCRIPTION OF THE INVENTION

The objective of this invention is a tri-state three-frequency band remotely configurable tuning probe system for single vertical axis slide screw impedance tuners, that allows larger frequency coverage beyond the capacity of each individual tuning probe, using only the single horizontal and vertical axis control mechanism of existing single probe, single frequency band tuners. This is done by combining two tuning slugs, a master slug and a slave slug of different length (if the slugs have the same length then we have a dual frequency band solution) into a configurable tuning probe assembly, the slugs being mounted and controlled by the same mobile tuner carriage using a single vertical axis mechanism as shown in FIG. 4, which (a) allows larger maximum to minimum frequency coverage, (b) can simply replace existing tuning probes in existing tuners without additional remote-control and (c) can use existing tuner calibration and data processing routines, all this effected with minimum cost and without requiring structural modification to existing tuners, additional internal remotely controlled mechanisms and/or external manual intervention. This is done by creating a tuning probe system with one master slug and one slave slug sliding and locking against each-other vertically and allowing three different operation modes: (1) a single slave slug, high frequency mode, FIG. 5A, (2) a double slug, low frequency mode (FIG. 5B) and (3) an alternative single master slug, medium, selected frequency mode (FIG. 5C).

DETAILED DESCRIPTION OF THE DRAWINGS

The invention and its mode of operation will be better understood from the following detailed description when read with the appended drawings in which.

FIGS. 5A through 5D depict the tuning probe system and operation modes: FIG. 5D depicts a 3D view of the system; FIG. 5A depicts the slave slug high frequency mode; FIG. 5B depicts the double slug low frequency mode and FIG. 5C depicts the master slug medium frequency mode.

Figure 6:
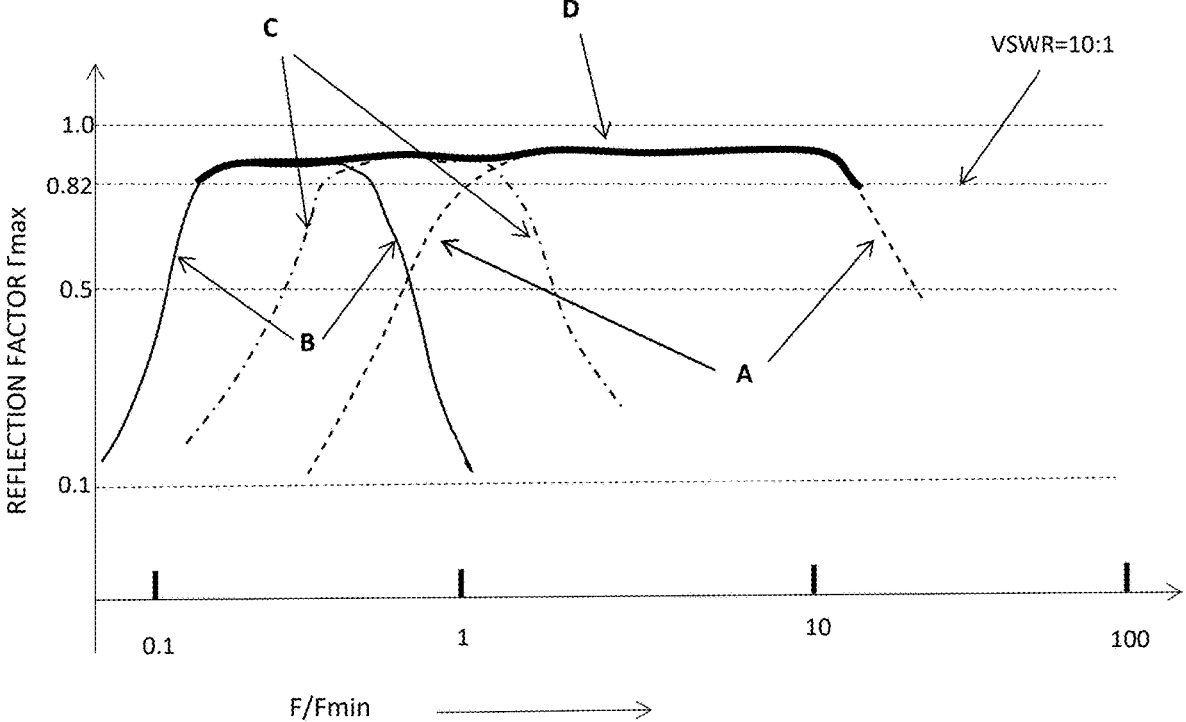

FIG. 6 depicts schematically the overlapping and typical maximum reflection factor of the possible modes of the various tuning probe system modes.

Figure 7:
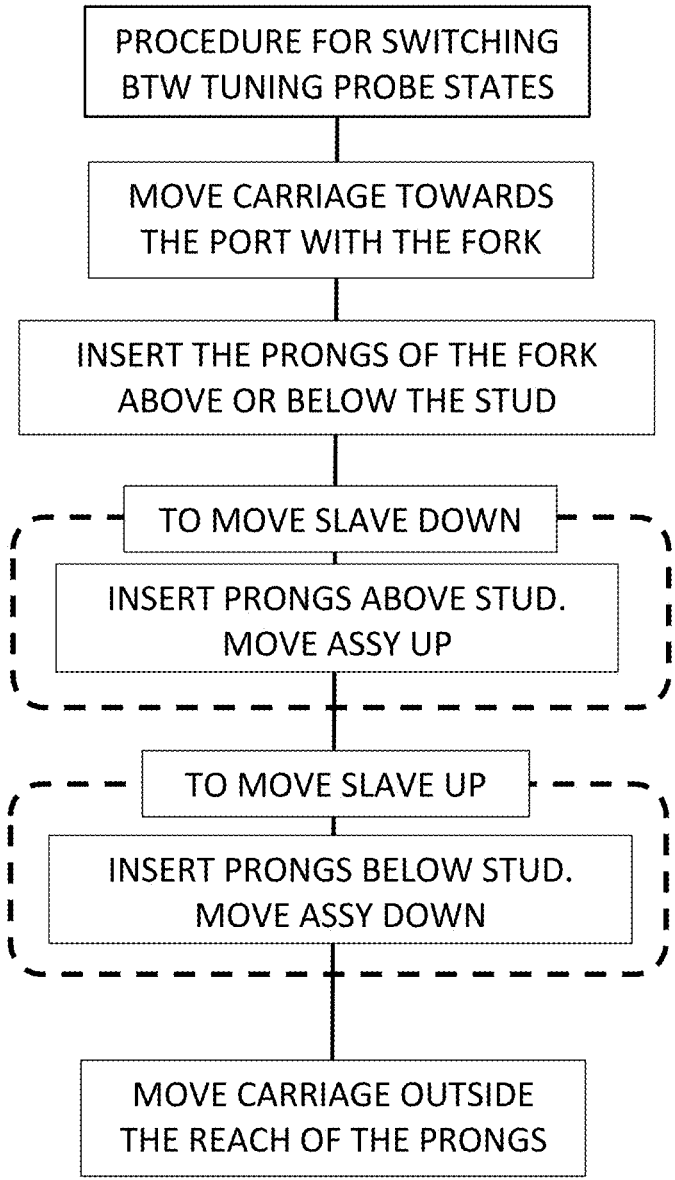

FIG. 7 depicts the flow chart of the procedure for changing operation modes.

Figure 8:
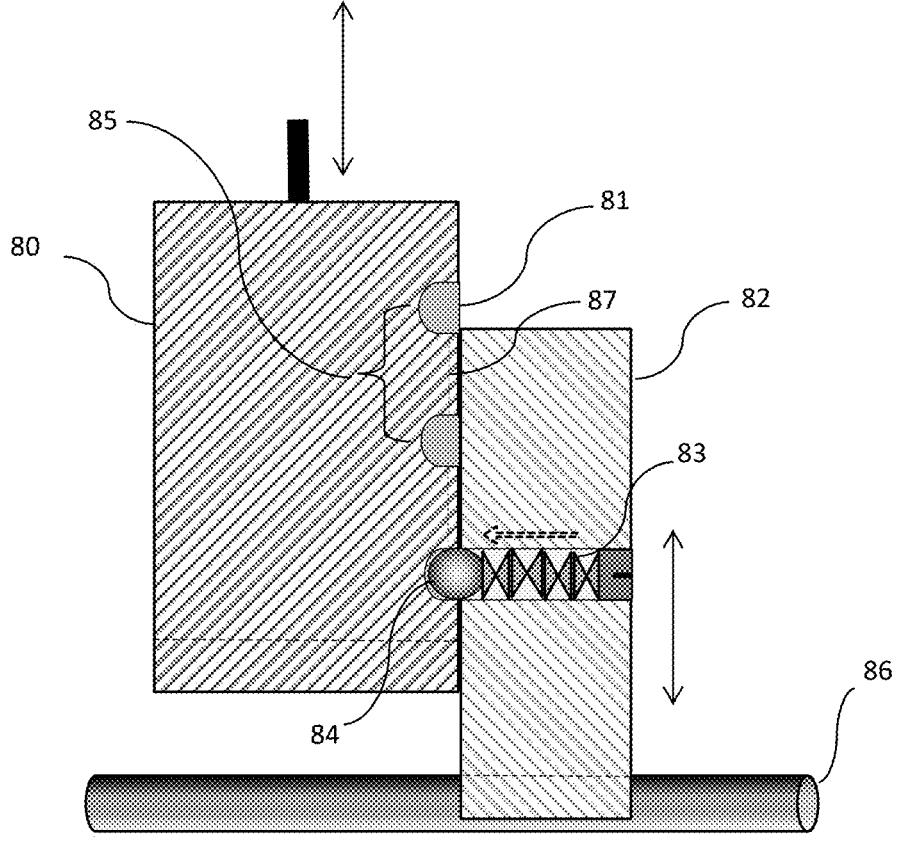

FIG. 8 depicts the vertical locking mechanism.

DETAILED DESCRIPTION OF THE INVENTION

Figure 1:
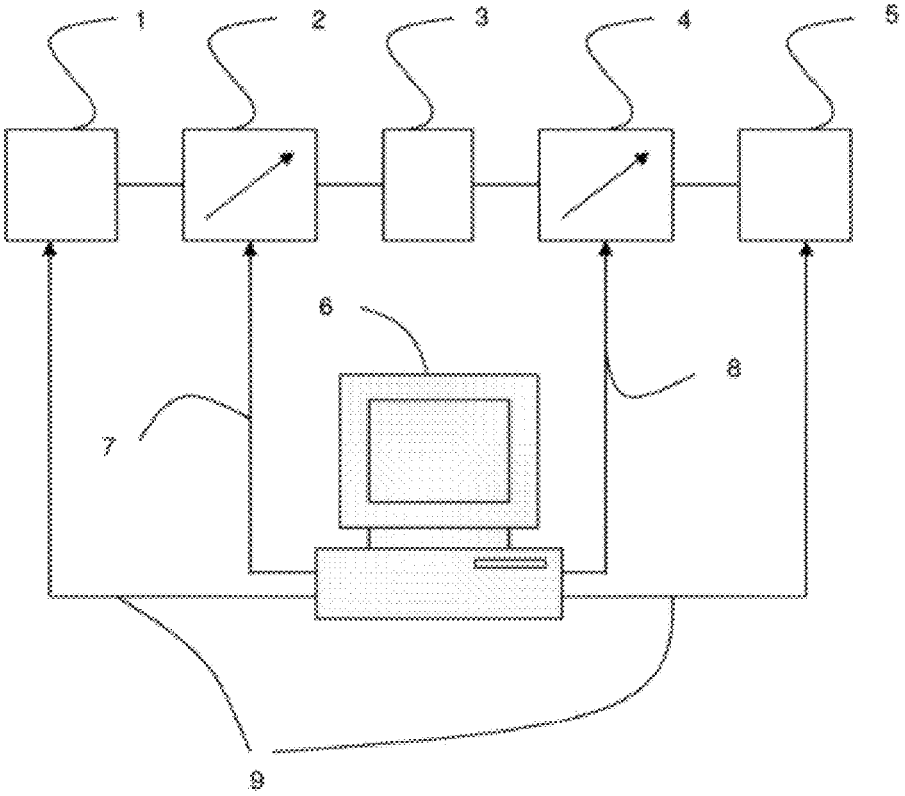
FIG. 1 depicts prior art, a typical scalar (measuring amplitude only) load pull test system using pre-calibrated passive tuners.
Figure 2:
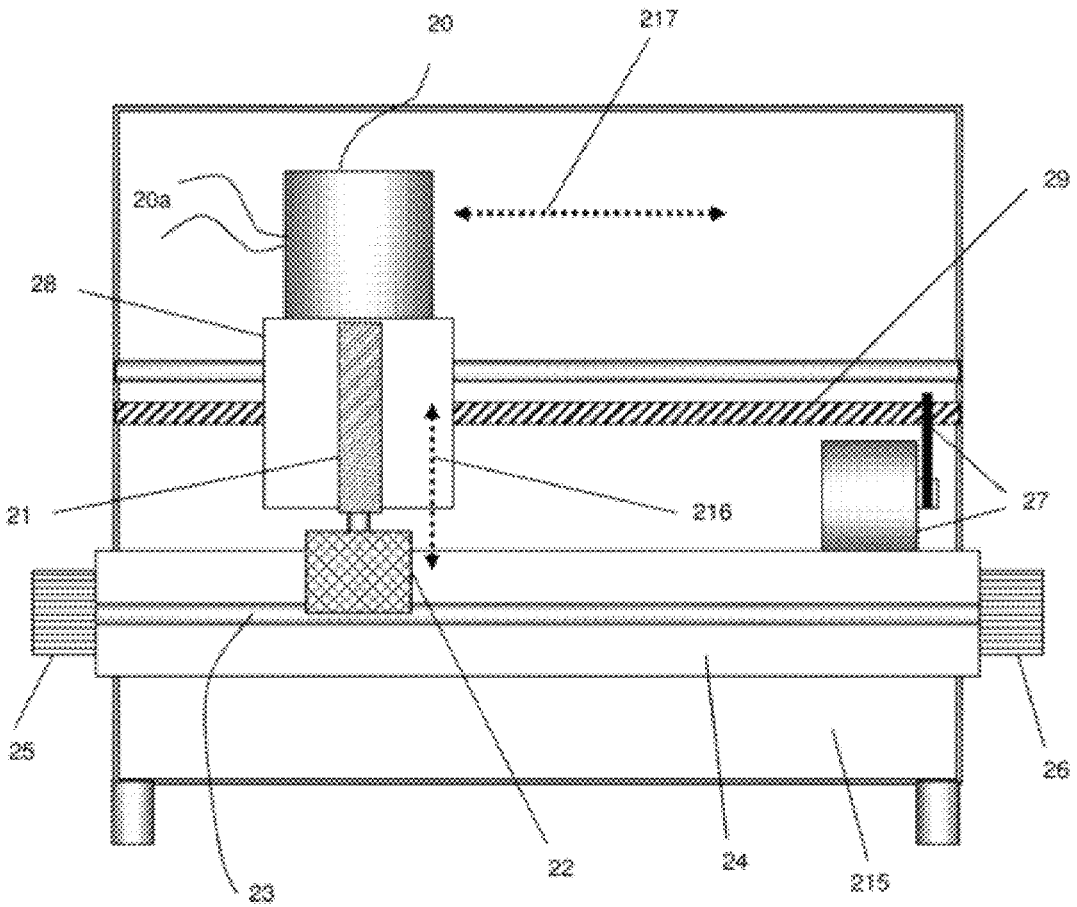
FIG. 2 depicts prior art, a schematic front view of a passive slide screw load pull tuner.

A typical slide screw tuner is shown in FIG. 2: it includes a slabline 24 with a center conductor 23, a test port 25 and an idle port 26. Inside the tuner housing 215 there is a mobile carriage 28 traveling 217 along the slabline, driven by a screw 29 and a motor and gear 27; in the carriage 28, there is a vertical axis mechanism 21 moving towards and away 216 from the slabline and holding a capacitively coupled tuning probe (slug) 22. The vertical axis mechanism 21 and the slug 22 are controlled by a second vertical motor 20 which is also remotely controlled 20a. It is this type of traditional, proven tuner technology this invention uses for the combination tuning probe.

Figure 3:
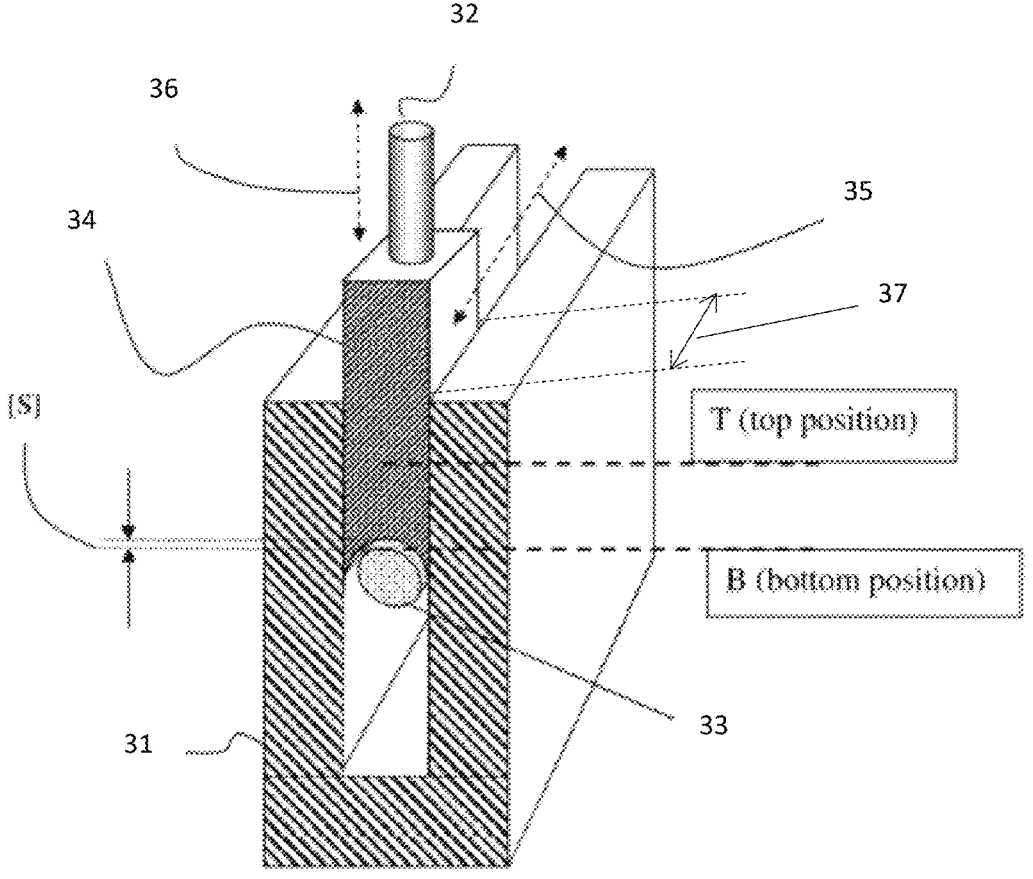
FIG. 3 depicts prior art, a perspective view of a metallic reflective tuning probe (slug).

The typical prior art tuning probe (slug) is shown in FIG. 3: it includes a body 34 and has a concave bottom matching the diameter of the center conductor 33 of the slabline 31 and a holding pin 32 to be attached to the vertical axis mechanism 21. The slug moves vertically 36 and horizontally 35 controlled by the axis 21 and the carriage 28. Vertically it moves between a top position T and a bottom position B leaving a small gap [S] to avoid a short circuit. The length 37 of the parallelepiped slug is defined along the axis of the slabline, the thickness is defined perpendicular to the axis of the slabline.

Figure 4:
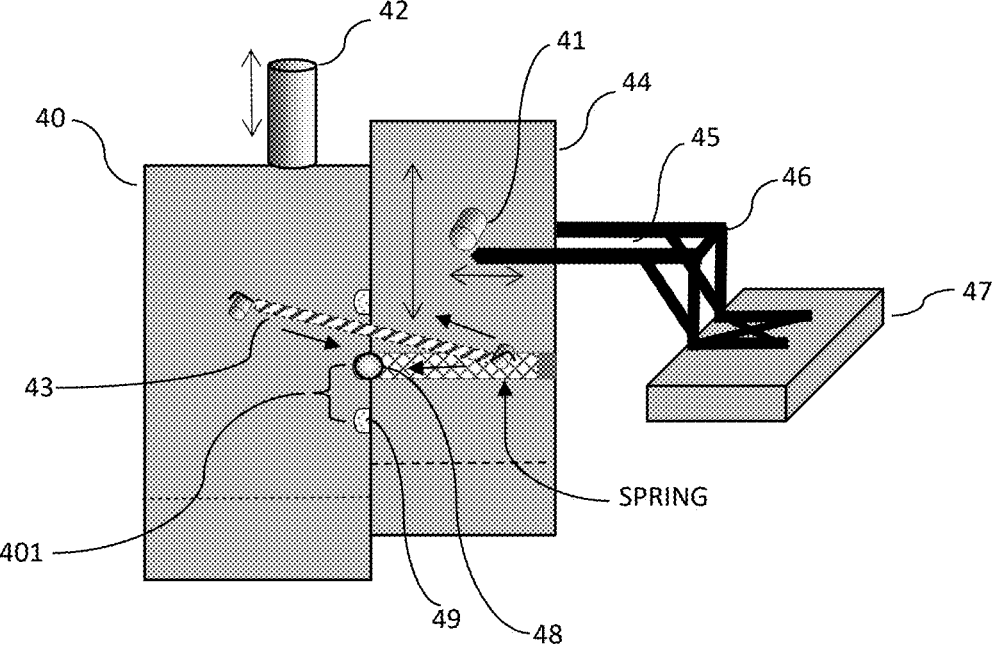
FIG. 4 depicts the configurable tuning probe system comprising the master slug (40), the slave slug (44) and the control fork (46).

The new tuning probe system is shown in FIG. 4: it includes a master slug 40 attached using the pin 42 to the vertical axis mechanism 21 like the prior art slug 34 of FIG. 3; it also includes a slave slug 44, which should be shorter than the master slug for reasons of robustness of the assembly, and which is used for reflecting the higher frequencies; the master slug 40 and the slave slug 44 are sliding vertically seamlessly against each-other, pre-loaded by the set of pulling springs 43 (one on each surface of the slugs). The sliding is lockable at three vertically aligned positions 48-49. These are defined by three troughs 48 cut into the center of the side wall of the master slug; the slave slug contains a spring-loaded steel ball 48 incorporated in its body (84 in FIG. 8) and protruding from the slug body, which hops from trough to trough as the slugs move vertically against each-other and locks the relative vertical position of the slugs. To control the relative vertical movement of the slugs, the slave slug has on its front and back side a protruding stud 41; it is by moving the carriage 28 towards the fork 46 and placing the pointed prongs 45 of the permanently 47 mounted fork 46 either below or above the stud 41 and moving vertically the assembly (i.e. of the master slug) having the slave slug immobilized by the prongs, that we can shift and lock one slug against the other vertically.

The tuning probe system and its modes of operation are shown in FIGS. 5A to 5D. FIG. 5D shows the overall picture, as described in FIG. 4, relative to the center conductor of the slabline; FIG. 5A shows the high frequency operation mode, where the (shorter) slave slug 44 is locked deeper than the master slug 40 and reflects the higher frequencies (trace A in FIG. 6) because the capacitance with the center conductor is smaller; FIG. 5B shows the low frequency mode of operation, where both slugs are adjusted at equal distance from the center conductor in which case their combined capacitance reaches a maximum and the frequency coverage is the lowest (trace B in FIG. 6); FIG. 5C shows the master slug 40 being lower than the withdrawn slave slug 44 creating reflection factor profile C; this is achieved by moving the assembly as high as necessary for the pointed prongs of the fork to catch below the stud 41 and then move the assembly and the master slug 40 downwards until the steel ball 48 hops into the top trough and locks the slave slug higher than the master slug; typical height difference 401 between the troughs, to ensure enough de-coupling of either elevated slug is approximately 1.5-2 diameters of the center conductor. Combined, the three modes of operation cover the frequency range designated by the letter D in FIG. 6.

The locking mechanism is visualized in a cross section of the tuning probe assembly in FIG. 8: we can see the master slug 80 and the slave slug 82. We can also see the three troughs 81 spaced vertically 85 by a distance that allows the combinations of the slugs to operate efficiently, i.e., if one slug is closest to the center conductor to create maximum reflection, the withdrawn slug is "invisible', meaning its own reflection is negligible. This distance depends on the overall size of the components and is roughly 1.5 to 2 times the diameter of the center conductor 86. The locking works when one slug slides vertically against the other (held together by the springs 43) and the steel ball 84, pushed by the spring 83, hops and locks in one of the troughs 81; between the troughs there is a shallow vertical groove 87 that guides the ball between the troughs and keeps the slugs aligned.

The procedure for switching between tuning probe states is shown in the flowchart of FIG. 7: in a first step the carriage 28 is moved towards the tuner port having the fork 46 permanently installed. Then, depending on the actual state of the tuning probe assembly, the vertical position is arranged for the fork to catch the stud 41 either from above or from below. If we want to lower the slave slug, we must catch above the stud; if we want to lift the slave slug we must catch below the stud. Then we move the master slug upwards or downwards for the steel ball 84 to hop into one of the troughs and lock. When this is done, we disengage the stud from the prongs and move the carriage away. Subsequently the tuner can be calibrated using prior art methods for the frequency corresponding to the setting of the slugs (see ref. 7).

The present invention discloses a configurable tuning probe system for single vertical axis load pull tuners, allowing operation in three modes (states), whereby allowing widening the instantaneous frequency bandwidth of the tuner, without the need for additional electronic and mechanical gear and remote control. The slugs are mounted and controlled to create a longer, a shorter and a medium slug in one automatically reconfigurable assembly. Obvious alternatives shall not impede the originality of the idea.

What is claimed is:

1. A remotely configurable double-slug tuning probe system for load pull tuner, comprising:

a remotely configurable double-slug tuning probe, and means for remotely configuring the double-slug tuning probe;

wherein the load pull tuner comprises a slabline with two sidewalls and a center conductor linking two ports, a control port, and an idle port and at least one remotely controlled mobile carriage, moving horizontally along the slabline, and including a single, remotely controlled, vertical axis mechanism which holds and controls the configurable double-slug tuning probe;

and wherein the configurable double-slug tuning probe is linked to the vertical axis mechanism and includes two metallic slugs, a master slug, and a slave slug, each having a parallelepiped body with a front, a back, two side walls and a bottom surface mirroring the center conductor, a horizontal length along the slabline, and a thickness allowing the slugs to slide-fit between the sidewalls of the slabline;

and wherein the means for remotely configuring the double-slug tuning probe comprise: studs protruding one from the front wall and one from the back wall of the slave slug at the same level, an interlock mechanism at common walls of the two slugs, an unmovable control device, linked with the slabline, and an automated double-slug configuration procedure;

and wherein the slave slug slides vertically, spring pulled against the master slug, and is lockable, versus the master slug using the interlock mechanism, at three lock positions, a bottom lock position, a center lock position, and a top lock position;

and wherein at the top lock position, the slave slug is withdrawn from the slabline, at the center lock position the two slugs are flush aligned at their bottom surface, and at the bottom lock position the master slug is withdrawn from the slabline.

2. The double-slug tuning probe of claim 1, wherein the slave slug has one spring-loaded steel ball protruding from the side wall of the slave slug between the slave slug and the master slug, and the side wall of the master slug between the master slug and the slave slug has three troughs aligned vertically, a top trough, a center trough, and a bottom trough, and wherein the spring-loaded steel ball rolls vertically on the side wall of the master slug between the master slug and the slave slug, drops into and fits snuggly into either of the troughs.

3. The unmovable control device of the configurable double-slug tuning probe system of claim 2, comprising a fork, which is attached to the slabline close to one of the ports, and has two horizontal prongs, having an opening between them that is larger than the thickness of the slugs and is less than the sum of the thickness of the slugs plus the protrusion of the studs.

4. The automated configuration procedure of claim 3 for switching the double-slug tuning probe between tuning modes comprises the following steps:

a) move the carriage close to the control port;

b) to lift the master slug relative to the slave slug, adjust the carriage position and the vertical axis for the prongs to catch above the studs and move the vertical axis upwards for the steel ball to latch into the bottom lock position;

c) to lift the slave slug relative to the master slug, adjust the carriage position and the vertical axis for the prongs to catch below the studs and move the vertical axis downwards for the steel ball to latch into the center or top lock position;

d) move the carriage outside of the reach of the prongs.

5. The configurable double-slug tuning probe of claim 4, wherein after the automated configuration procedure, the slugs are locked firmly on each-other sidewise while moving vertically and horizontally as a single unit.

6. The automatically configurable double-slug tuning probe system for load pull tuner of claim 1, wherein the slave slug is no longer than the master slug.

7. The configurable double-slug tuning probe of claim 1, wherein the slugs are spring pre-loaded towards each-other using two expansion springs having two ends each and placed one spring on the front wall and one spring on the back wall of the slugs anchored one end of either spring on the master slug and the other end on the slave slug.

8. The configurable double-slug tuning probe system of claim 1, wherein the vertical axis mechanism and the horizontal position of the mobile carriage of the load pull tuner are remotely controlled using stepper motors and gear.

* * * * *